United States Patent
Yasuda et al.

(10) Patent No.: US 8,241,834 B2
(45) Date of Patent: Aug. 14, 2012

(54) OPTICAL RECORDING MEDIUM AND PRODUCTION METHOD THEREFOR, AND SPUTTERING TARGET AND PRODUCTION METHOD THEREFOR

(75) Inventors: Kouichi Yasuda, Tokyo (JP); Shigeki Takagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 324 days.

(21) Appl. No.: 12/423,473

(22) Filed: Apr. 14, 2009

(65) Prior Publication Data

US 2009/0274033 A1    Nov. 5, 2009

(30) Foreign Application Priority Data

May 1, 2008   (JP) ................................. 2008-119544

(51) Int. Cl.
 *G11B 7/24*   (2006.01)
 *C23C 14/34*  (2006.01)
 *C23C 14/08*  (2006.01)

(52) U.S. Cl. ............... 430/270.13; 428/64.5; 428/64.6; 369/288; 369/275.2; 369/275.5; 204/192.26

(58) Field of Classification Search .................. None
 See application file for complete search history.

(56) References Cited

U.S. PATENT DOCUMENTS

| | | | |
|---|---|---|---|
| 4,624,914 A | | 11/1986 | Kimura et al. |
| 4,656,079 A | * | 4/1987 | Yamada et al. ............ 428/209 |
| 4,939,717 A | * | 7/1990 | Ohno et al. ............ 369/116 |
| 6,229,785 B1 | | 5/2001 | Kitaura et al. |
| 2004/0222479 A1 | * | 11/2004 | Uno et al. ............ 257/432 |

FOREIGN PATENT DOCUMENTS

| | | | |
|---|---|---|---|
| JP | 60-109039 | * | 6/1985 |
| JP | 60-112488 | * | 6/1985 |
| JP | 61-068296 |   | 4/1986 |
| JP | 61-227167 | * | 10/1986 |
| JP | 62-030085 | * | 2/1987 |
| JP | 63-140440 | * | 6/1988 |
| JP | 64-051989 |   | 2/1989 |
| JP | 01-106478 | * | 4/1989 |
| JP | 01-303645 | * | 12/1989 |
| JP | 03-008141 | * | 1/1991 |
| JP | 3638152 |   | 1/2005 |

OTHER PUBLICATIONS

Japanese Office Action for corresponding JP2008-119544 issued on Jan. 12, 2010.

* cited by examiner

*Primary Examiner* — Martin Angebranndt
(74) *Attorney, Agent, or Firm* — K&L Gates LLP

(57) ABSTRACT

An optical recording medium includes a substrate having features that define track regions, an optical recording layer disposed on the substrate, and a light-transmitting layer disposed on the optical recording layer. The optical recording layer has a composition of $(Sb_2Se_3)_w Te_x O_y Pd_z$, where w, x, y, and z each represent a molar percent and satisfy 10 (mol %)$\leq$w$\leq$60 (mol %), 0 (mol %)<x$\leq$60 (mol %), 30 (mol %)$\leq$y$\leq$60 (mol %), 10 (mol %)$\leq$z$\leq$30 (mol %), and w+x+y+z=100.

10 Claims, 2 Drawing Sheets

US 8,241,834 B2

OPTICAL RECORDING MEDIUM AND PRODUCTION METHOD THEREFOR, AND SPUTTERING TARGET AND PRODUCTION METHOD THEREFOR

CROSS REFERENCES TO RELATED APPLICATIONS

The present application claims priority to Japanese Priority Patent Application JP 2008-119544 filed in the Japan Patent Office on May 1, 2008, the entire content of which is hereby incorporated by reference.

BACKGROUND

The present application relates to an optical recording medium and a production method therefor, and a sputtering target and production method therefor. In particular, it relates to an optical recording medium such as a recordable blu-ray disk (BD-R) and a production method therefor, and a sputtering target suitable for use in production of such an optical recording medium and a production method therefor.

Recently, in the field of data recording, research and development on and commercialization of optical data recording technologies have seen rapid advancement. With the optical data recording technology, data can be recorded on and reproduced from an optical recording medium in a noncontact manner. The technology also has an advantage that it is adoptable to various forms of data recording, such as recordable, read only, and rewritable-type data, recording. In this respect, the technology can contribute to creating bulk; files at low cost and is adoptable to a wide variety of usages ranging from industrial to commercial.

Increasing the storage capacity of an optical recording medium (optical disk) for enabling various types of optical recording technology has been mainly achieved by decreasing the spot size at a focal plane through decreasing the wavelength of a laser beam, i.e. a light source used for recording and reproducing data, and using an objective lens with a high numerical aperture (NA). For example, for a compact disc (CD) having a storage capacity of 650 MB, a 780 nm laser beam and an NA 0.45 objective lens are used. For a digital versatile disk read only memory (DVD-ROM) having a storage capacity of 4.7 GB, a 650 nm laser beam and an NA 0.6 objective lens are used.

For a next generation optical disk system, an optical recording medium (optical disk) constituted by a substrate, an optical recording layer on the substrate, and a thin light-transmitting layer about 0.1 mm in thickness on the optical recording layer is used. A laser beam is applied to the optical recording layer from the light-transmitting layer side. Use of a laser beam having a wavelength of 450 nm or less and an objective lens with an NA of 0.78 or more enables a high storage capacity of 25 GB or more. How data is recorded on or read from the optical recording medium (optical medium) is illustrated in a schematic diagram of FIG. 1A. FIG. 1B is a cross-sectional view of this optical recording medium (optical disk), and FIGS. 1C and 1D are each an enlarged partial cross-sectional view showing a part of the cross-section of the optical recording medium (optical disk) shown in FIG. 1B.

An optical recording medium (optical disk) 10 includes a substrate (disk substrate) 20 about 1.1 mm in thickness composed of for example, a polycarbonate (PC) resin and having a featured main surface in which a recess 21 is formed, and an optical layer 33 formed along the featured surface that includes the recess 21. The optical recording medium 10 is of a phase change type and includes an optical recording multi-layer structure 30 constituted by, for example, an incident-side protective film 34, the optical recording layer 33, and a reflective-side protective film 32. The reflective-side protective film 32 is located at the substrate side. A light-transmitting layer 41 having a thickness of for example, 0.1 mm is disposed on the optical recording layer 33 (in particular, on the optical recording multilayer structure 30).

Data is recorded or reproduced on the optical recording medium 10 by using an objective lens 12 having an NA of 0.78 or more (e.g. NA=0.85) and applying a laser beam having a wavelength of 450 nm or less (e.g., 380 nm to 420 nm) from the light-transmitting layer side so that the laser beam is focused on the optical recording layer 33. In reproducing the recorded data, feedback light reflected by the optical recording layer 33 is received by a photo receptor (not shown), particular signals are generated in a signal processing circuit, and reproduced signals can be obtained.

The optical recording layer 33 has features formed by the recess 21 in the surface of the substrate 20. The recess 21 is, for example, formed as a spiral continuous groove or circular grooves at predetermined pitches. The track regions are defined by these features. The recess in the features defining the track regions are called "groove" and a protrusion in the features defining the track regions is called "land". Either the land or the groove is used as recording regions. Note that the storage capacity can be further increased by employing a land-groove recording technology that enables data recording on both the land and groove.

It has been reported that a non-stoichiometric mixture of a metalloid, namely, tellurium oxide, and palladium (Pd) ($TeO_xPd$, wherein $0<x<2$) can be used as the material for the optical recording layer 33 of the phase-change optical recording medium 10 (e.g. refer to Japanese Unexamined Patent Application Publication No. 61-068296). Data is recorded on an optical recording layer 33 composed of such a material on the basis of the following principle: the laser beam applied to the optical recording layer 33 melts the optical recording layer 33 and then as the optical recording layer 33 cools, phase separation between tellurium oxide and palladium occurs and changes the optical constant, based on which data is recorded. In other words, since the reflectance of the optical recording layer 33 changes between before and after irradiation with the laser beam, data can be reproduced by detecting the differences in reflectance.

Japanese Patent No. 3638152 describes an optical data recording medium and production method therefor, a method for recording and reproducing optical data, and a device for recording and reproducing optical data. In this patent, the optical data recording medium includes a transparent substrate and a data layer on the transparent substrate, the data layer containing at least Te, O, and atom M (wherein M is at least one element selected from the group consisting of metal elements, metalloid elements, and semiconductor elements). This data layer contains 40 atom % or more and 60 atom % or less of O, 2 atom % or more and 25 atom % or less of atom M, and 15 atom % or more and 58 atom % or less of Te, and has a thickness of 10 nm or more and 70 nm or less.

SUMMARY

When a tellurium oxide-palladium mixture is used as the material for the optical recording layer 33 as disclosed in Japanese Unexamined Patent Application Publication No. 61-068296 and data is recorded on the optical recording layer 33 by using an objective lens having an NA of about 0.8 and a short wavelength laser beam of about 380 nm to 420 nm, the sensitivity of the optical recording layer 33 becomes low and the laser power is insufficient.

Moreover, although Japanese Patent No. 3638152 gives Pd, Sb, Se, and the like as the examples of the atom M, Sb and Se are not specifically described. Furthermore, the data layer disclosed in Japanese Patent No. 3638152 has difficulty meeting strong demand for an optical recording layer with an ever higher recording sensitivity. In forming the optical recording layer by a sputtering method, the film deposition rate is desirably high to improve the productivity of optical recording media. However, the method for forming the data layer disclosed in Japanese Patent 3638152 has a difficulty fulfilling such demand.

It is desirable to provide an optical recording medium that, includes an optical recording layer formed by sputtering at a higher deposition rate and achieves a higher recording sensitivity, a method of making such an optical recording medium, a sputtering target suitable for use in such a method, and a method of making such a sputtering target.

An optical recording medium according to a first embodiment includes (A) a substrate having features that define track regions, (B) an optical recording layer disposed on the substrate, and (C) a light-transmitting layer disposed on the optical recording layer.

The composition of the optical recording layer is $(Sb_2Se_3)_w Te_x O_y Pd_z$. In this formula, w, x, y, and z each represent a molar percent and satisfy the relationships described below.

An optical recording medium according to a second embodiment includes (A) a substrate having features that define track regions, (B) two or more optical recording layers disposed on the substrate, (C) a light-transmitting layer disposed on the optical recording layer at the top, and (D) an intermediate layer disposed between the optical recording layers.

The composition of each optical recording layer is $(Sb_2Se_3)_w Te_x O_y Pd_z$. In this formula, w, x, y, and z each represent a molar percent and satisfy the relationships described below.

For the optical recording medium of the second embodiment, the composition of each optical recording layer may be adequately determined on the basis of the light-transmittance, reflectance, and absorption desired for each optical recording layer.

A method of producing an optical recording medium according to one embodiment includes forming an optical recording layer containing $(Sb_2Se_3)_w Te_x O_y Pd_z$ on a substrate having features that define track regions and forming a light-transmitting layer on the optical recording layer.

The optical recording layer is formed by sputtering using a sputtering target, having a composition of $(Sb_2Se_3)_W Te_X Pd_Z$ and oxygen gas as a process gas. In this formula, v, x, y, z, W, X, and Z each represent a molar percent and satisfy the relationships described below:

10 (mol %) $\leq$ w $\leq$ 60 (mol %);
0 (mol %) < x $\leq$ 60 (mol %);
30 (mol %) $\leq$ y $\leq$ 60 (mol %);
10 (mol %) $\leq$ z $\leq$ 30 (mol %);
w+x+y+z=100;
5 (mol %) $\leq$ W $\leq$ 90 (mol %), preferably 10 (mol %) $\leq$ W $\leq$ 90 (mol %);
0 (mol %) < X $\leq$ 80 (mol %);
10 (mol %) $\leq$ Z $\leq$ 30 (mol %), preferably 15 (mol %) $\leq$ Z $\leq$ 25 (mol %); and
W+X+Z=100.

At w less than 10 mol %, the recording sensitivity improves very little. If Te is completely replaced with $(Sb_2Se_3)$, then w=60 mol %. Thus, the upper limit for w is 60 mol %. Oxygen atoms are the matrix component in the optical recording layer. At y of less than 30 mol %, phase separation may not readily occur when the optical recording layer is irradiated with light to record data, the optical constant of the optical recording layer may show little changes, and data may not be readily readable. At y exceeding 60 mol %, however, the light-transmittance of the optical recording layer becomes excessively high, and the optical absorption of the optical recording layer decreases, resulting in a decrease in recording sensitivity of the optical recording layer. At z less than 10 mol %, the palladium (Pd) concentration in the optical recording layer is low. Thus, when the optical recording layer is irradiated with light, to record data, the optical constant of the optical recording layer may undergo only little changes, which renders it difficult to read data. In contrast, at z exceeding 30 mol. %, the thermal conductivity of the optical recording layer may become excessively high, and the recording sensitivity may be degraded. It should be noted here that when the optical recording layer is composed of a mixture of tellurium oxide and palladium, a high laser power may be desired to melt the optical recording layer since the thermal conductivity of the tellurium (Te) is not sufficiently low.

The optical recording media of the first and second embodiments and an optical recording method produced by the method described above preferably satisfy w+z$\geq$26 (mol %) to further improve the recording sensitivity.

For the optical recording media of the first and second embodiments and an optical recording method produced by the method described above that satisfy w+z$\geq$26, data is preferably recorded on and reproduced from the optical recording layer by applying a light beam having a wavelength of 450 nm or less (in particular, a light beam having a wavelength in the range of 380 nm to 420 nm) through an objective lens having a numerical aperture (NA) of 0.78 or more (in particular, NA of 0.85±0.05).

For the optical recording media of the first and second embodiments and an optical recording method produced by the method described above in the above-described preferable forms, the optical recording layer may be irradiated with light through the light-transmitting layer and/or these optical recording media may be configured to be of a recordable (standard name: BD-R) type.

A sputtering target according to one embodiment has a composition of $(Sb_2Se_3)_W Te_X Pd_Z$. A method of producing a sputtering target according to one embodiment includes mixing diantimony triselenide $(Sb_2Se_3)$ powder, tellurium (Te) powder, and palladium (Pd) powder, and firing the resulting mixture to obtain a sputtering target having a composition of $(Sb_2Se_3)_W Te_X Pd_Z$. In this formula, W, X, and Z each represent a molar percent and satisfy the relationships described above.

The substrates of the optical recording media of the first and second embodiment and the optical recording media produced by the above-described methods in the above-described preferable forms may be composed of a transparent or opaque material that satisfies desired mechanical strength and accuracy. Examples of the material for the substrate include acrylic resins such as polycarbonate (PC) resins and polymethyl methacrylate (PMMA) resins, polyolefin resins such as norbornene resins, epoxy resins, acrylonitrile-styrene copolymer resins, ABS resins, polystyrene resins, silicone resins, fluorine resins, methane resins, glass, quartz, metals, and paper.

These optical recording media usually include optical recording multilayer structures including the optical recording layers. The optical recording multilayer structure may have a three-layer structure including a reflective-side protective film (lower layer protective film), the optical receding layer, and an incident-side protective film (upper layer protective film). The reflective-side protective film has a high thermal conductivity so as not to obstruct diffusion of heat to the light-reflecting film and is formed to be as thin as is optically permissible. The incident-side protective film is designed to suppress to a certain extent the reflection of light so that the light can be effectively absorbed in the optical recording layer. Examples of the material for the reflective-side protective film and the incident-side protective film include various light-transmitting dielectric materials including metal oxides such as silicon oxide, zinc oxide, aluminum oxide, tin oxide, titanium oxide, indium oxide, magnesium oxide, and zirconium oxide; metal nitrides such as silicon nitride, aluminum nitride, titanium nitride, and zirconium nitride; metal sulfides such as zinc sulfide, indium sulfide, and tantalum sulfide; carbides such as silicon carbide, tantalum carbide, boron carbide, tungsten carbide, titanium carbide, and zirconium carbide and diamond-like carbon (DLC); mixtures of these various materials such as a mixture of silicon oxide, chromium oxide, and zirconium oxide and a mixture of zinc sulfide and silicon oxide. The film thickness is, for example, 5 nm to 100 nm. Providing the protective films will prevent deterioration of the optical recording layers in an accelerated test under high temperature and high humidity, and thus the deterioration of signals can be suppressed. A light-reflecting film may be provided between the reflective-side protective film (lower layer protective film) and the substrate. The light-reflecting film is composed of a metal or an alloy and has a high thermal conductivity. The light-reflecting film not only reflects at least part of light transmitted through the optical recording layer (i.e. not only a high signal intensity is obtained), but also functions as a kind of heat sink, which allows the temperature decrease to be steep after application of light to the optical recording layer. The light-reflecting film is, for example, composed of silver (Ag), aluminum (Al), or a silver-palladium alloy and has a thickness in the range of 5 nm to 100 nm. Forming a dielectric layer composed of, for example, zinc sulfide between the optical recording layer and the incident-side protective film (upper layer protective film) moderates the stress generated by heating and cooling of the optical recording layer.

In the optical recording media described above, the light-transmitting layer (also called "cover layer") is made of a polycarbonate sheet material, for example, and is bonded to the optical recording layer with an adhesive (a sheet resin bonding technique). Alternatively, the light-transmitting layer is composed of a UV-curable resin and formed by applying the resin on the optical recording layer by a spin coating method, for example, and applying UV rays to cure the resin (a resin coating technique). Yet alternatively, the light-transmitting layer is made of a sheet-shaped material bonded to the optical recording layer with a pressure-sensitive adhesive (double-sided adhesive tape) (sheet PSA bonding technique).

A hard coating layer may be provided on the light-transmitting layer. The hard coating layer may be composed of a polymer such as an acrylic or silicone polymer, a fluorine resin, or an organic-inorganic hybrid material (e.g., microparticles such as silica having a high hardness and low refractive index dispersed in a polymeric material).

According to the second embodiment of the optical recording medium, the number of optical recording layers may be any number not less than 2. For example, two, four, or eight optical recording layers may be provided. When there are a plurality of optical recording layers, the layer closest to the substrate is referred to as "first optical recording layer" ($L_0$ recording layer), and the layers sequentially disposed on the first optical recording layers are respectively referred to as a second optical recording layer ($L_1$ recording layer), a third optical recording layer ($L_2$ recording layer), a fourth optical recording layer ($L_3$ recording layer), and so on. The intermediate layer (also called "spacer layer") is made of, for example, an adhesive sheet, a UV-curable resin, or an UV-curable adhesive sheet. For example, an optical recording medium having two optical recording layers can be formed by the method described below. Basically, an optical recording medium having three or more optical recording layers can be produced by the same method. That is, an optical recording medium having $L_0$ to $L_N$ recording layers (optical recording medium having N optical recording layers) can be produced by repeating the above-described operation (N−1) times, basically. The thickness of the intermediate layer may be adequately determined on the basis of the intensity of light desired to record and reproduce data in each optical recording layer.

(1) A method including bonding a substrate 1.1 mm in thickness having the $L_0$ recording layer thereon to a 75 μm-thick sheet having the $L_1$ recording layer formed thereon with an adhesive sheet such as a double-sided tape 25 μm in thickness, or a UV curable resin 25 μm in thickness.

(2) A method including providing an a UV-curable adhesive sheet on a substrate 1.1 mm in thickness having the $L_0$ recording layer thereon, curing the adhesive sheet by UV irradiation while a stamper carrying features defining track regions for the $L^1$ recording layer is pressed against the adhesive sheet, removing the stamper, and forming the $L_1$ recording layer on the cured adhesive sheet.

(3) A method including forming an intermediate layer composed of a UV curable resin on a stamper carrying features that define track regions for the $L_1$ recording layer so that the intermediate layer is given features defining the track regions for the $L_1$ recording layer, bonding the intermediate layer on the stamper to a substrate 1.1 mm in thickness having the $L_1$ recording layer thereon with a UV-curable adhesive, curing the adhesive by UV irradiation, removing the stamper to leave the intermediate layer having the features defining the track regions for the $L_1$ recording layer, and then forming the $L_1$ recording layer on the intermediate layer.

In the optical recording media described above, the substrate has features that define track regions and data is written on the track regions. An in-groove method whereby data is written on the recessed part or an on-groove method whereby data is written on protruding part may be employed. The depth (height) of the features is about several nanometers to about 100 nm. For example, the depth may be 20 nm.

The light incident on the optical recording layer is partly reflected and partly transmitted, and the rest is absorbed. The absorbed light is converted to heat which is used to record data on the optical recording layer. The reflected light is used to read data and to detect control error signals for focus control and tracking control. As described above, the optical recording layer is composed of a five element system (Sb, Se, Te, O, and Pd) of a phase change type. Microparticles of Sb, Se, Te, and Pd are dispersed in the optical recording layer in an amorphous state. In order to form recording marks, the optical recording layer is irradiated with light, and oxidation reaction, melting, and phase separation occur. In particular, as the optical recording layer irradiated with light is heated to a melting temperature or higher, the microparticles grow and crystallize during cooling. In such a state, the refractive index becomes higher than that before irradiation with light. Data can be read out by such changes in refractive index. The thickness of the optical recording layer is 4 nm to 100 nm, preferably 5 nm to 20 nm, for example.

The laser light source that emits light (laser beam) and the optical pickup including the objective lens may have the same structure as those of common laser light sources and optical pickups.

For the sputtering target and the production method therefor, the particle size of the diantimony triselenide ($Sb_2Se_3$) powder, tellurium (Te) powder, and palladium (Pd) powder may be adequately determined by conducting various tests. These powders can be obtained with an adequate grinder and a classifier. A mixture of these powders can be obtained by using an adequate mixer. After these powders are given an adequate form using an adequate binder, the powders may be fired at an adequate temperature condition and atmosphere for an adequate firing time.

The composition of the optical recording layers of the optical recording media described above is $(Sb_2Se_3)_w Te_x O_y Pd_z$. This composition improves the recording sensitivity of the optical recording layer and increases the deposition rate for forming the optical recording layer by sputtering. Improving the recording sensitivity of the optical recording layer allows recording with a lower laser power. Moreover, during sputtering, larger electric power can be applied to the sputtering target, and the deposition rate for forming the optical recording layer can be improved. Above all, since the recording sensitivity of the optical recording layer is improved, the number of optical recording layers to be contained in the optical recording medium can be easily increased further.

Additional features and advantages are described herein, and will be apparent from the following Detailed Description and the figures.

DETAILED DESCRIPTION

The present application will now be described below in greater detail with reference to the drawings according to an embodiment.

EXAMPLE 1

EXAMPLE 1 relates to an optical recording medium a first embodiment and a production method therefor, and a sputtering target and a production method therefor.

Figure 1A:
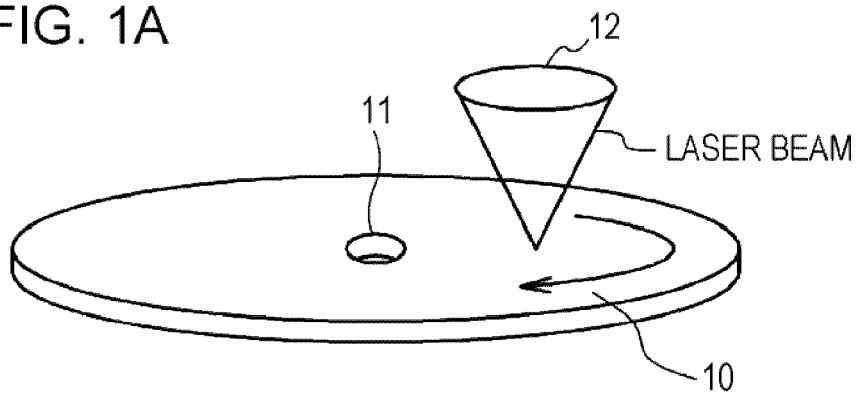
FIG. 1A is a schematic diagram showing how data is recorded on or read from an optical recording medium (optical disk).
Figure 1B:
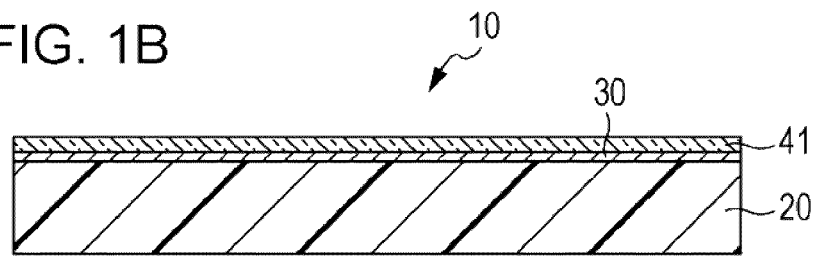
FIG. 1B is a schematic cross-sectional view of an optical recording medium of EXAMPLE 1.
Figure 1C:
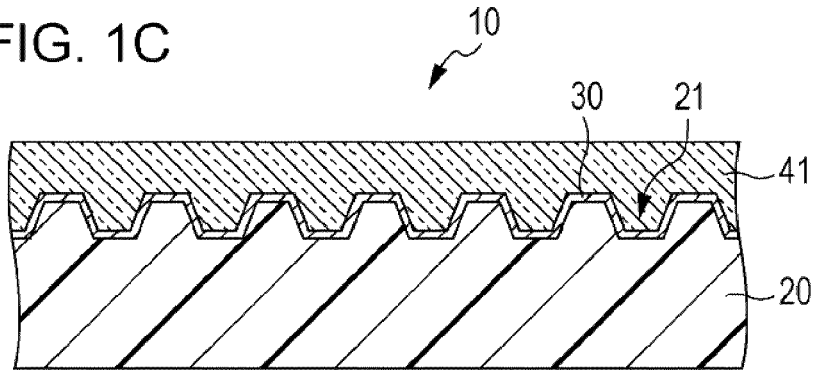
FIG. 1C is an enlarged schematic cross-sectional view showing a part of a cross-section of the optical recording medium of EXAMPLE 1.
Figure 1D:
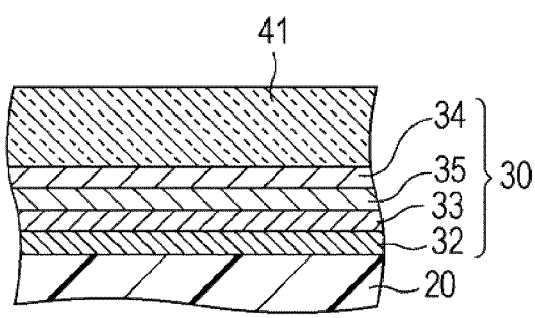
FIG. 1D is a further enlarged schematic cross-sectional view showing a part of the cross-section of the optical recording medium of EXAMPLE 1.

FIG. 1B is a schematic cross-sectional view of an optical recording medium (optical disk) 10 of EXAMPLE 1. As shown in enlarged schematic cross-sectional views of FIGS. 1C and 1D, the optical recording medium 10 includes the following:

(A) a substrate 20 in which features defining track regions are formed;

(B) an optical recording layer 33 disposed on the substrate 20; and (C) a light-transmitting layer 41 disposed on the optical recording layer 33.

The composition of the optical recording layer 33 is $(Sb_2Se_3)_w Te_x O_y Pd_z$, where w, x, y, and z each indicate a molar percent and satisfy the following relationships:

10 (mol %) $\leq$ w $\leq$ 60 (mol %);
0 (mol %) $<$ x $\leq$ 60 (mol %);
30 (mol %) $\leq$ y $\leq$ 60 (mol %);
10 (mol %) $\leq$ z $\leq$ 30 (mol %); and
w+x+y+z=100

To be more specific, in EXAMPLE 1, the values were set as follows:

w=15 mol % (Sb: 6 at %, Se: 9 at %);
x=24 mol % (Te: 24 at %);
y=50 mol % (O: 50 at %); and
z=11 mol % (Pd: 11 at %).

The thickness of the optical recording layer 33 was 5 nm.

In recording or reproducing data on or from the optical recording medium 10 of EXAMPLE 1, light is applied to the optical recording layer 33 through the light-transmitting layer 41 as shown in the schematic perspective view of FIG. 1A. The optical recording medium 10 is a write-once blue-ray disc (standard name: BD-R). Data is recorded on and reproduced from the optical recording layer 33 by applying a light beam, having a wavelength of 450 nm or less (e.g., 380 nm to 420 nm, more specifically, a laser beam having a wavelength of 405 nm) through an objective lens 12 having a numerical aperture (NA) of 0.78 or more (specifically, an NA of 0.85±0.05). In reproducing the recorded data, feedback light reflected by the optical recording layer 33 is received by a photo receptor (not shown), particular signals are generated in a signal processing circuit, and reproduced signals can be obtained.

The optical recording medium 10 has a shape of disk with a center hole 11 at the center and rotates in the arrow direction shown in FIG. 1A. In this optical recording medium 10, a recess 21 is formed in one main surface of a substrate (disk substrate) 20 about 1.1 mm in thickness composed of for example, a polycarbonate (PC) resin, thereby imparting features (recess and protrusions) to the main surface. An optical layer 33 is formed along these features in the main surface including the recess 21. The optical recording layer 33 also has features formed by the recess 21 in the surface of the substrate 20. The recess 21 is, for example, formed as a spiral continuous groove at predetermined pitches, and these features define the track regions. One of the land and the groove is used as recording regions. Alternatively, a land-groove recording technology that enables data recording on both the land and groove may be employed.

The optical, recording medium 10 of EXAMPLE 1 is of a phase change type and includes an optical recording multilayer structure 30 constituted by, for example, an incident-side protective film (upper layer protective film) 34, the optical recording layer 33 including a phase change film, and a reflective-side protective film (lower layer protective film) 32. The reflective-side protective film 32 is disposed at the substrate side and on the substrate 20. The incident-side protective film 34 and the reflective-side protective film 32 are composed of a silicon oxide/chromium oxide/zirconium oxide mixture and have a thickness of 10 nm. A zinc sulfide layer 35 having a thickness of 30 nm is provided between the incident-side protective film 34 and the optical recording layer 33. A light-transmitting layer 41 which is a light-transmitting resin film having a thickness of, for example, 0.1 mm and being composed of a polycarbonate resin is disposed on the optical recording layer 33 (in particular, on the optical recording multilayer structure 30).

The features are formed as a spiral with a pitch of 0.32 μm (distance from the center of a recess to the center of an adjacent recess) in a main surface of the substrate 20. The features are formed as a continuous groove and have a depth of 20 nm.

A method for producing the optical recording medium (optical disk) 10 of EXAMPLE 1 will now be described. In making the medium, a sputtering target having a composition of $(Sb_2Se_3)_w Te_x Pd_z$ used for forming the optical recording layer 33 is prepared in advance.

In the composition,
5 (mol %)≦W≦90 (mol %);
0 (mol %)<X≦80 (mol %);
10 (mol %)≦Z≦30 (mol. %); and
W+X+Z=100.
In particular,
W=30 (mol %);
X=48 (mol %); and
Z=22 (mol %).

This sputtering target can be obtained by firing a mixture of diantimony triselenide $(Sb_2Se_3)$ powder, tellurium (Te) powder, and palladium (Pd) powder.

[Step 100]

First, a stamper for forming features in the substrate 20 by transfer is prepared. The surface of the stamper has a protrusion, which is a reverse pattern (complementary pattern) of the recess 21 shown in FIGS. 1B and 1C.

The stamper can be prepared by the following process. First, a positive photoresist is applied on a polished surface of a flat glass substrate by spin coating or the like to form a photoresist layer on the glass substrate. A pattern corresponding to the features on the substrate is exposed onto the photoresist layer and developed with an alkaline developing agent. As a result, a master having a photoresist layer with a pattern corresponding to the pattern of the features of the substrate can be obtained. Next, a metal layer of nickel or the like having a predetermined thickness is formed on the master by electroless and electrolytic plating. The metal layer is then separated from the master. This plating layer having features which are the reverse of the features of the master formed of the photoresist layer is used as the stamper.

Then common injection molding is conducted with this stamper to obtain the substrate 20 having features that define the track regions.

[Step 110]

Next, the reflective-side protective film 32 having a thickness of 10 nm and composed of a silicon oxide/chromium oxide/zirconium oxide mixture was formed by sputtering, and the optical recording layer 33 with a thickness of 5 nm was formed on the reflective-side protective film 32 by sputtering using the sputtering target described above. The zinc sulfide layer 35 having a thickness of 30 nm was formed on the optical recording layer 33 by sputtering, and the incident-side protective film 34 having a thickness of 10 nm and composed of a silicon oxide/chromium oxide/zirconium oxide mixture was formed by sputtering on the zinc sulfide layer 35.

The conditions for forming the optical recording layer 33 were as follows:
Target: as indicated above
Process gas: $Ar/O_2$=43 sccm/7 sccm
Applied power: 4 watt/cm$^2$

[Step 120]

A light-transmitting layer 41 constituted by a light-transmitting resin film composed of a polycarbonate resin having a thickness of 0.1 mm was bonded on the incident-side protective film 34 with a UV-curable resin. Thus, the optical recording medium (optical disk) 10 of EXAMPLE 1 was obtained.

In Step 110, the sputtering power during deposition of the optical recording layer 33 could be set to 4 watt/cm$^2$, as described above.

A recording laser beam having a wavelength of 405 nm was focused on the optical recording layer 33 of the optical recording medium 10 through an objective lens having an NA of 0.85 to record a random signal having a bit length of 0.13 μm. The jitter value of the signal recorded on the optical recording medium and the power of the recording laser beam are indicated in Table 1. In EXAMPLE 2, REFERENCE EXAMPLE, and COMPARATIVE EXAMPLE 1 below, a random signal having a bit length of 0.13 μm was also recorded in the same manner. The jitter value of the signal recorded on the optical recording medium and the power of the recording laser beam are also indicated in Table 1.

An optical recording medium (optical disk) including an optical recording layer having a composition of $(Sb_2Se_3)_w Te_x O_y Pd_z$ with w, x, y, and z described below was formed. Note that the optical recording medium of REFERENCE EXAMPLE had the same structure and configuration as the optical recording medium of EXAMPLE 1 except for the composition of the optical recording layer.
w=10 mol % (Sb: 4 at %, Se: 6 at %)
x=29 mol % (Te: 29 at %)
y=50 mol % (O: 50 at %)
z=11 mol % (Pd: 11 at %)

An optical recording medium (optical disk) including an optical recording layer having a composition of $Te_x O_y Pd_z$ (x=30 mol %, y=48 mol %, z=22 mol %) was formed. Here, the value in terms of mol % is equal to the value in terms of at %. The optical recording medium of COMPARATIVE EXAMPLE 1 had the same structure and configuration as the optical recording medium of EXAMPLE 1 except for the composition of the optical recording layer. In Step 110, a sputtering power of only 1 watt/cm$^2$ could be applied during deposition of the optical recording layer.

TABLE 1

|  | Jitter value (%) | Power of recording laser beam (mW) |
| --- | --- | --- |
| EXAMPLE 1 | 6 | 7.5 |
| REFERENCE EXAMPLE | 6 | 9 |
| COMPARATIVE EXAMPLE 1 | 6 | 16 |
| EXAMPLE 2 | 6 | 6 |

Comparison between EXAMPLE 1 and COMPARATIVE EXAMPLE 1 finds that the power of the recording laser beam can be decreased when the optical recording layer has a composition of $(Sb_2Se_3)_w Te_x O_y Pd_z$. In other words, the optical recording medium of EXAMPLE 1 has a higher recording sensitivity than the optical recording medium of COMPARATIVE EXAMPLE 1. Comparison between EXAMPLE 1 and REFERENCE EXAMPLE shows that the recording sensitivity increases with the sum of w and z.

The composition of the optical recording layer of the optical recording medium of EXAMPLE 1 is $((Sb_2Se_3)_w Te_x O_y Pd_z$. The optical recording layer composed of Se, Te, O, and Pd exhibited an improved (higher) recording sensitivity than the optical layer composed of Te, O, and Pd since incorporation of Se resulted in a decreased thermal conductivity in the optical recording layer. However, Se has a lower melting point than Te. Thus, in forming the optical recording layer by a sputtering technique, electrical power as high as that applied to a sputtering target composed of Te and Pd is can rarely be applied to a sputtering target composed of Se, Te, and Pd. In other words, the deposition rate for forming the optical recording layer is not sufficiently increased. In contrast, the melting point of diantimony triselenide ($Sb_2Se_3$) is 590° C., which is higher than the melting point (220° C.) of selenium. Thus, when the sputtering target is composed of Sb, Se, Te, and Pd, a larger electrical power can be applied to the target, and the deposition rate for the optical recording layer can be increased. The recording sensitivity of the optical recording layer can be improved when the optical recording layer is composed of Sb, Se, Te, O, and Pd.

EXAMPLE 2

Figure 2:
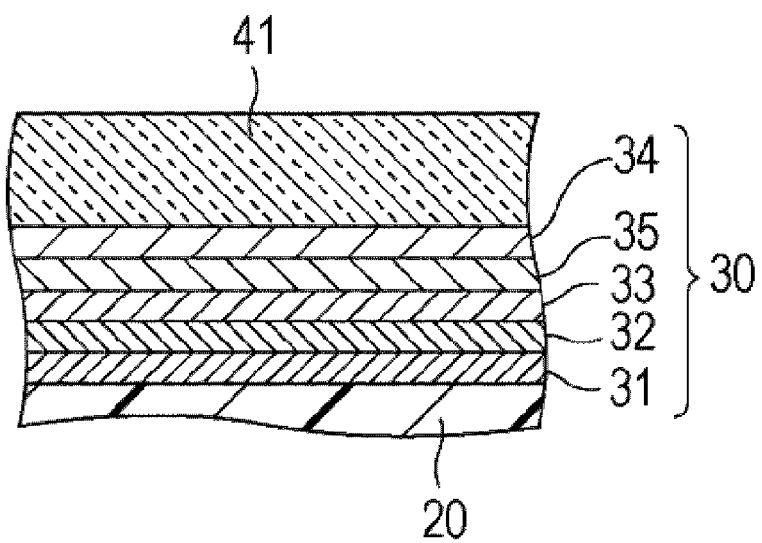
FIG. 2 is a enlarged schematic cross-sectional view of a part of a cross-section of an optical recording medium (optical disc) of EXAMPLE 2.

EXAMPLE 2 is a modification of EXAMPLE 1. As shown in a schematic cross-section of part of the optical recording multilayer structure 30 in FIG. 2, a light-reflecting film 31 having a thickness of 30 nm and composed of a silver-palladium alloy is disposed between the substrate 20 and the reflective-side protective film (lower layer protective film) 32 of the optical recording medium of EXAMPLE 2. The light-reflecting film 31 is formed by sputtering. The optical recording medium of EXAMPLE 2 has the same structure and configuration as the optical recording medium of EXAMPLE 1 except for this light-reflecting film 31. The jitter value of the signal recorded on the optical recording medium of EXAMPLE 2 and the power of the recording laser beam are indicated in Table 1.

EXAMPLE 3

EXAMPLE 3 relates to an optical recording medium according to a second embodiment and a production method therefor. The optical recording medium of EXAMPLE 3 includes the following:

(A) a substrate having features that define track regions;

(B) two or more (four in EXAMPLE 3) optical recording layers disposed on the substrate;

(C) a light-transmitting layer disposed on the optical recording layer at the top; and (D) an intermediate layer disposed between the optical recording layers (in EXAMPLE 3, three intermediate layers are provided).

The composition of each optical recording layer is $(Sb_2Se_3)_wTe_xO_yPd_z$. Specific compositions, structures, and thickness of optical recording multilayer structures including the optical recording layers and the intermediate layers are indicated in Table 2. The compositions, structures, and thickness the optical recording multilayer structures including the optical recording layers and the intermediate layers are determined on the basis of the light-transmittance, reflectance, and absorption desired for each optical recording layer. In Table 2, "optical recording layer composition" of the optical recording layer means the following composition. In Table 2, "protective film composition 1" and "protective film composition 2" means the following compositions.

[Optical Recording Layer Composition]

w=15 mol % (Sb: 6 at %, Se: 9 at %)

x=24 mol % (Te: 24 at %)

y=50 mol % (O: 50 at %)

z=11 mol % (Pd: 11 at %)

[Protective Film Composition 1]

A silicon oxide/chromium oxide/zirconium oxide mixture.

[Protective Film Composition 2]

A 80 mol % zinc sulfide/20 mol % silicon oxide mixture.

TABLE 2

| | | |
|---|---|---|
| Fourth optical recording multilayer structure | | |
| Incident-side protective film | Protective film composition 1 | 15 nm |
| Incident-side protective film | Protective film composition 2 | 40 nm |
| Fourth optical recording layer | Optical recording layer composition | 5 nm |
| Reflective-side protective film | Protective film composition 1 | 16 nm |
| Intermediate layer | Composed of UV-curable resin and having a featured surface | 15 μm |
| Third optical recording multilayer structure | | |
| Incident-side protective film | Protective film composition 1 | 15 nm |
| Incident-side protective film | Protective film composition 2 | 31 nm |
| Third optical recording layer | Optical recording layer composition | 8 nm |
| Reflective-side protective film | Protective film composition 1 | 14 nm |
| Intermediate layer | Composed of UV-curable resin and having a featured surface | 12 μm |
| Second optical recording multilayer structure | | |
| Incident-side protective film | Protective film composition 1 | 10 nm |
| Incident-side protective film | Protective film composition 2 | 5 nm |
| Second optical recording layer | Optical recording layer composition | 12 nm |
| Reflective-side protective film | Protective film composition 1 | 10 nm |
| Intermediate layer | Composed of UV-curable resin and having a featured surface | 18 μm |
| First optical recording multilayer structure | | |
| Incident-side protective film | Protective film composition 1 | 15 nm |
| Incident-side protective film | Protective film composition 2 | 45 nm |
| First optical recording layer | Optical recording layer composition | 14 nm |
| Reflective-side protective film | Protective film composition 2 | 10 nm |
| Reflective-side protective film | Protective film composition 1 | 10 nm |
| Light-reflecting film | Ag alloy | 30 nm |

In EXAMPLE 3, the same sputtering target as that used in EXAMPLE 1 was used. A method for making the optical recording medium (optical disk) of EXAMPLE 3 will now be described.

[Step 300]

As in Step 100 of EXAMPLE 1, common injection molding is conducted with a stamper to obtain a substrate having features that define the track regions. As in EXAMPLE 1, the features are formed in a main surface of this substrate at a pitch of 0.32 μm by forming a spiral. The features are formed as a continuous groove and have a depth of 20 nm.

[Step 310]

Next, various layers and films shown in Table 2 are sequentially formed by sputtering in substantially the same manner as in Step 110 of EXAMPLE 1 to obtain a first optical recording multilayer structure, and then an intermediate layer is formed. In particular, an intermediate layer composed of a UV-curable resin is formed on a stamper with features (a spiral with a pitch of 0.32 μm and a depth of 20 nm) for defining the track regions for a $L_1$ recording layer so that the intermediate layer is rendered the features that define the track regions for the $L_1$ recording layer. The intermediate layer on the stamper is bonded with a UV curable adhesive (not shown) to a substrate 1.1 mm in thickness having an $L_0$ recording layer formed thereon, and the adhesive is cured by UV irradiation. Then the stamper is removed to leave the intermediate layer having features for defining the track regions for the $L_1$ recording layer on the substrate. A second optical recording multilayer structure that constitutes the $L_1$ recording layer is then formed on the intermediate layer. Subsequently, an intermediate layer, a third optical recording structure, another intermediate layer, and a fourth optical recording multilayer structure are sequentially formed by the same process. The conditions for forming the optical recording layers of the optical recording multilayer structures are identical to those employed in EXAMPLE 1 except for the thickness.

[Step 320]

A light-transmitting layer constituted by a light-transmitting resin film composed of a polycarbonate resin having a thickness of 55 μm was bonded on the fourth optical recording multilayer structure with a UV-curable resin. Thus, the optical recording medium (optical disk) of EXAMPLE 3 was obtained.

The light transmittance and reflectance of each of the obtained optical recording layers are indicated in Table 3 below. The light reflectance is the value of light transmitted in the optical recording layer disposed above the target optical recording layer measured at the incident surface of the target optical recording layer.

TABLE 3

| | Light transmittance (%) | Reflectance (%) |
|---|---|---|
| Fourth optical recording layer ($L_3$ recording layer) | 82 | 2.9 |
| Third optical recording layer ($L_2$ recording layer) | 77 | 3.0 |
| Second optical recording layer ($L_1$ recording layer) | 67 | 3.4 |
| First optical recording layer ($L_0$ recording layer) | 21 | 3.9 |

A recording laser beam having a wavelength of 405 nm was focused on the optical recording layer of the optical recording medium through an objective lens having an NA of 0.85 to record a random signal having a bit length of 0.13 μm. The jitter value of the signal recorded on the optical recording medium and the power of the recording laser beam are indicated in Table 4.

An optical recording medium (optical disk) having four optical recording layers having a composition of $Te_xO_yPd_z$ (x=30 mol %, y=48 mol %, z=22 mol %) was formed as COMPARATIVE EXAMPLE 3. Here, the value in terms of mol % is equal to the value in terms of at %. The optical recording medium of COMPARATIVE EXAMPLE 3 had the same structure and configuration as the optical recording medium of EXAMPLE 3 except for the composition of the optical recording layer. A recording laser beam having a wavelength of 405 nm was focused on each optical recording layer of the optical recording medium through an objective lens having an NA of 0.85 to record a random signal having a bit length of 0.13 μm. In Table 4, "relative power value" is the value of power of a laser beam for recording data on each optical recording layer (the fourth optical recording layer ($L_3$ recording layer), the third optical recording layer ($L_2$ recording layer), the second optical recording layer ($L_1$ recording layer), and the first optical recording layer ($L_0$ recording layer)) of EXAMPLE 3 relative to the power (100%) of the laser beam for recording data on each optical recording layer (the fourth optical recording layer ($L_3$ recording layer), the third optical recording layer ($L_2$ recording layer), the second optical recording layer ($L_1$ recording layer), and the first optical recording layer ($L_0$ recording layer)) of COMPARATIVE EXAMPLE 3.

TABLE 4

| | Jitter value (%) | Relative power value (%) |
|---|---|---|
| Fourth optical recording layer ($L_3$ recording layer) | 6 | 70 |
| Third optical recording layer ($L_2$ recording layer) | 6 | 68 |
| Second optical recording layer ($L_1$ recording layer) | 6 | 77 |
| First optical recording layer ($L_0$ recording layer) | 6 | 52 |

As shown in Table 4, the value of power of the laser beam for recording data could be reduced by employing the optical recording layers having the composition of EXAMPLE 3. In other words, the recording sensitivity of each optical recording layer was improved.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An optical recording medium comprising:
   a substrate having features that define track regions;
   an optical recording layer disposed on the substrate; and
   a light-transmitting layer disposed on the optical recording layer,
   wherein the optical recording layer has a composition of $(Sb_2Se_3)_wTe_xO_yPd_z$, where w, x, y, and z each represent a molar percent and satisfy
   10 (mol %)$\leq$w$\leq$60 (mol %);
   0 (mol %)<x$\leq$60 (mol %);
   30 (mol %)$\leq$y$\leq$60 (mol %);

10 (mol %) $\leq z \leq$ 30 (mol %); and w+x+y+z=100, wherein data is recorded on and is capable of being reproduced from the optical recording layer by irradiating the optical recording layer with a light beam having a recording power ranging from about 6 to about 9 mW, and the recorded data is capable of readout with a jitter value of about 6%.

2. The optical recording medium according to claim 1, wherein w+z$\geq$26 (mol %) is satisfied.

3. The optical recording medium according to claim 1, wherein data is recorded on and reproduced from the optical recording layer by irradiating the optical recording layer with a light beam having a wavelength of 380 nm to 420 nm through an objective lens having a numerical aperture of 0.85±0.05.

4. The optical recording medium according to claim 3, wherein the optical recording layer is irradiated with the light beam through the light-transmitting layer.

5. An optical recording medium comprising:

a substrate having features that define track regions;

two or more optical recording layers disposed on the substrate;

a light-transmitting layer disposed on the optical recording layer at the top; and an intermediate layer disposed between the optical recording layers, wherein each optical recording layer has a composition of $(Sb_2Se_3)_w Te_x O_y Pd_z$, where w, x, y, and z each represent a molar percent and satisfy 10 (mol %) $\leq$ w $\leq$ 60 (mol %);

0 (mol %) < x $\leq$ 60 (mol %);

30 (mol %) $\leq$ y $\leq$ 60 (mol %);

10 (mol %) $\leq$ z $\leq$ 30 (mol %);

w+x+y+z=100, wherein data is recorded on and is capable of being reproduced from the optical recording layer by irradiating the optical recording layer with a light beam having a recording power ranging from about 6 to about 9 mW, and the recorded data is capable of readout with a jitter value of about 6%.

6. The optical recording medium according to claim 5, wherein w+z$\geq$26 (mol %) is satisfied.

7. The optical recording medium according to claim 5, wherein data is recorded on and reproduced from each optical recording layer by irradiating the optical recording layer with a light beam having a wavelength of 380 nm to 420 nm through an objective lens having a numerical aperture of 0.85±0.05.

8. The optical recording medium according to claim 7, wherein the optical recording layer is irradiated with the light beam through the light-transmitting layer.

9. A method of producing an optical recording medium, comprising:

forming an optical recording layer containing $(Sb_2Se_3)_w Te_x O_y Pd_z$ on a substrate having features that define track regions; and forming a light-transmitting layer on the optical recording layer, wherein the optical recording layer is formed by sputtering using a sputtering target having a composition of $(Sb_2Se_3)_W Te_X Pd_Z$ and oxygen gas as a process gas, where w, x, y, z, W, X, and Z each represent a molar percent and satisfy 10 (mol %) $\leq$ w $\leq$ 60 (mol %);

0 (mol %) < x $\leq$ 60 (mol %);

30 (mol %) $\leq$ y $\leq$ 60 (mol %);

10 (mol %) $\leq$ z $\leq$ 30 (mol %);

w+x+y+z=100, wherein data is recorded on and is capable of being reproduced from the optical recording layer by irradiating the optical recording layer with a light beam having a recording power ranging from about 6 to about 9 mW, and the recorded data is capable of readout with a jitter value of about 6%.

10. The method according to claim 9, wherein w+z$\geq$26 (mol %) is satisfied.

* * * * *